US010046521B2

(12) United States Patent
Walker et al.

(10) Patent No.: US 10,046,521 B2
(45) Date of Patent: Aug. 14, 2018

(54) REMOTELY-ACCESSIBLE ADDITIVE MANUFACTURING SYSTEMS AND METHODS

(71) Applicant: Jabil Inc., St. Petersburg, FL (US)

(72) Inventors: Christopher Walker, Moscow, ID (US); John Feusi, Moscow, ID (US)

(73) Assignee: JABIL INC., St. Petersburg, FL (US)

( * ) Notice: Subject to any disclaimer, the term of this patent is extended or adjusted under 35 U.S.C. 154(b) by 618 days.

(21) Appl. No.: 14/598,180

(22) Filed: Jan. 15, 2015

(65) Prior Publication Data

US 2015/0197064 A1 Jul. 16, 2015

Related U.S. Application Data

(60) Provisional application No. 61/927,980, filed on Jan. 16, 2014.

(51) Int. Cl.
| | |
|---|---|
| *B29C 64/386* | (2017.01) |
| *B29C 67/00* | (2017.01) |
| *G06F 17/50* | (2006.01) |
| *H04L 29/08* | (2006.01) |
| *B33Y 50/02* | (2015.01) |

(52) U.S. Cl.
CPC ........ *B29C 67/0088* (2013.01); *B29C 64/386* (2017.08); *G06F 17/50* (2013.01); *H04L 67/125* (2013.01); *B33Y 50/02* (2014.12); *H04L 67/02* (2013.01)

(58) Field of Classification Search
None
See application file for complete search history.

(56) References Cited

U.S. PATENT DOCUMENTS

| | | | | |
|---|---|---|---|---|
| 9,898,776 | B2* | 2/2018 | Apsley | G06Q 30/0635 |
| 2003/0033207 | A1* | 2/2003 | Litke | G06Q 10/087 |
| | | | | 705/26.5 |
| 2003/0208293 | A1* | 11/2003 | Mountcastle, III | |
| | | | | G05B 19/41865 |
| | | | | 700/96 |
| 2008/0215176 | A1* | 9/2008 | Borovinskih | G06Q 50/04 |
| | | | | 700/117 |
| 2011/0087350 | A1* | 4/2011 | Fogel | G06F 17/50 |
| | | | | 700/98 |

(Continued)

*Primary Examiner* — Isaac T Tecklu
(74) *Attorney, Agent, or Firm* — Volpe and Koenig, P.C.

(57) ABSTRACT

A system and method for manufacturing objects in an automated fashion to improve the accessibility and effectiveness of manufacturing technologies. The system may be comprised of one or more web-accessible servers, one or more clients that may communicate with the server, and one or more manufacturing apparatuses that may communicate with one or more clients or servers. The server turns designs into manufacturing instructions using user-specified settings and databases of manufacturing parameters for particular apparatuses and/or manufacturing methods. The system may facilitate communication and revision of designs, manufacturing parameters, or manufacturing instructions between the user and the owner or operator of the manufacturing apparatus. The client may facilitate communication between the server and manufacturing apparatus, may monitor the manufacturing apparatus, and may be physically internal or external to the apparatus.

17 Claims, 8 Drawing Sheets

(56) References Cited

U.S. PATENT DOCUMENTS

| | | | |
|---|---|---|---|
| 2011/0153052 A1* | 6/2011 | Pettibone | G06F 17/5004 700/98 |
| 2012/0105903 A1* | 5/2012 | Pettis | G06F 3/12 358/1.14 |
| 2013/0297320 A1* | 11/2013 | Buser | B33Y 40/00 704/275 |
| 2013/0328228 A1* | 12/2013 | Pettis | F16M 13/022 264/40.1 |
| 2014/0156053 A1* | 6/2014 | Mahdavi | B29C 67/0059 700/119 |
| 2014/0228997 A1* | 8/2014 | Phillips | G06F 17/50 700/182 |
| 2015/0158252 A1* | 6/2015 | Liu | B29C 67/0088 700/98 |
| 2015/0165690 A1* | 6/2015 | Tow | B33Y 80/00 700/119 |
| 2016/0129637 A1* | 5/2016 | Zhou | B33Y 50/00 700/98 |

\* cited by examiner

REMOTELY-ACCESSIBLE ADDITIVE MANUFACTURING SYSTEMS AND METHODS

PRIORITY

This application claims priority to U.S. provisional application Ser. No. 61/927,980, filed Jan. 16, 2014, which is hereby incorporated by reference in its entirety.

BACKGROUND

Three dimensional (3D) printing (also referred to as additive manufacturing, rapid prototyping, or solid freeform fabrication) is an important set of manufacturing technologies.

Additive manufacturing allows users to create objects from digital designs such as those produced by most CAD programs. Since the designs may be digital they also may be changed rapidly so that users may test or produce a large variety of different designs. Since additive manufacturing may not require any dedicated or specific tooling to produce a particular object, the start-up costs to manufacturing or to switch designs may be minimal. Further, additive manufacturing may produce very complex objects that could be either cost-prohibitive or impossible to produce using other manufacturing technologies.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Various embodiments contemplate a system that may contain a web server and a plurality of manufacturing apparatuses at a plurality of locations. The manufacturing apparatuses may be connected to the web server directly or through a client device. The web server may contain information about manufacturing apparatuses such as, for example, the technologies that the manufacturing apparatuses use, the feedstocks that have been loaded, the manufacturing tolerances, and the general abilities to produce features or designs, and/or manufacturing parameter options describing the suitability of apparatuses for manufacturing particular designs or meeting particular manufacturing parameters. The manufacturing technologies may be additive, such as, for example, varieties of 3D printing, or the manufacturing technologies may be subtractive, such as CNC milling, laser, plasma, or water cutting, or turning of bulk feedstock material.

Alternately, or in addition, the manufacturing apparatuses may be owned or operated by a plurality of parties. Third parties may pay to have their manufacturing apparatuses integrated with the system. Third parties may specify information about the manufacturing apparatus on the web server. The system may provide third parties with the ability to send manufacturing instructions to the apparatuses remotely. Alternately, or additionally, the system may provide third parties the ability to receive, revise, or return quotes or orders for manufacturing designs or manufacturing parameters from other users or a subset of users of the system or other third parties.

Users may access the web server, upload object designs, and select manufacturing parameters. The server may perform some processing on the object designs such as automatic file or mesh repair, for example. Additionally or alternatively, for example, the server may combine its knowledge of the manufacturing apparatuses and a user's design and a user's chosen manufacturing parameters to create a set of manufacturing instructions suited for one or more particular manufacturing technologies and/or machines. The user may review the manufacturing instructions, for example, by viewing a 3D representation of the manufacturing instructions, to ensure and/or confirm that the instructions are correct. The user may also be provided with additional information such as the volume, mass, or the cost or time required to manufacture the object as specified.

Additionally or alternatively, the user may request that the manufacturing instructions be reviewed by an owning party. The owning party may review the manufacturing instructions as well as additional information that may be provided such as the object design, volume, mass, cost, or time required to manufacture the object as specified. The owning party may revise the manufacturing parameters, or the cost, or time required to manufacture the object. The owning party may then send the revised design object, or manufacturing parameters or instructions, or additional information back to the user. Additionally or alternatively the user may now revise their object design or manufacturing parameters. This process of revision may continue until the owning party and user approve the manufacturing instructions.

Additionally or alternatively the user may pay to have the object created. If they do so the manufacturing instructions may be sent to a manufacturing apparatus suitable for the design and manufacturing parameters set by the user. The manufacturing instructions may be sent directly to the manufacturing apparatus or, for example, to a client device which passes the instructions on to the manufacturing apparatus. Or the manufacturing instructions may be sent to the owning party or operator of the manufacturing apparatus. The owning party or operator may then pass the manufacturing instructions to the manufacturing apparatus. The server may keep track of manufacturing progress and may notify the user when the object has been manufactured or when a problem has occurred.

If, for example, a client device is used to relay the manufacturing instructions to the manufacturing apparatus, the client device may automatically retrieve the instructions from the server. The client device may automatically start the manufacture of the object or it may require activation from the operator. The client device may monitor the manufacturing progress or the status of the manufacturing apparatus. The client device may relay this information to the server.

The time or cost to manufacture the object may depend on the volume of the design, the time required to manufacture the object, the amount and type of material used, or other factors, such as the manufacturing jobs already enqueued for a particular machine or group of machines. For instance, a user may be notified that several jobs will be manufactured prior to their job and be given an estimated start and completion time for their job. A user may be able to pay additional fees so that the job is expedited.

BRIEF DESCRIPTION OF THE DRAWINGS

The detailed description is set forth with reference to the accompanying figures. In the figures, the left-most digit(s) of a reference number may identify the figure in which the FIG. 1 depicts an overview of an illustrative system.

DETAILED DESCRIPTION

Figure 1:
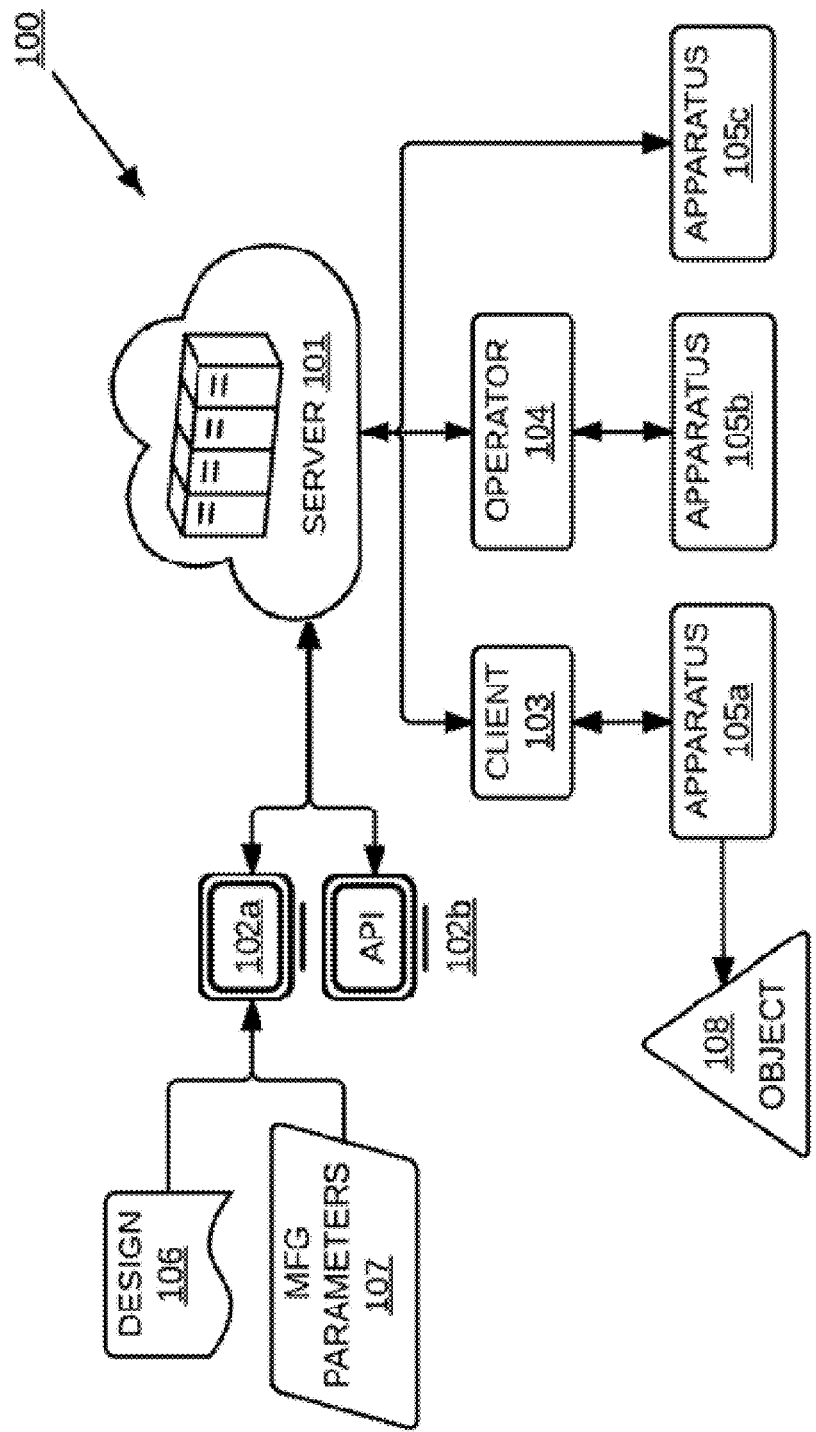

References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Thus the term "or" should generally be understood to mean "and/or" and so forth.

One issue with additive manufacturing or 3D printing as implemented currently is that many potential users of the technology may not have access to a 3D printer. Many people may not be able to afford the capital cost of owning a 3D printer, and many people may not be part of an organization or institution such as, a university, a community-operated workspace, or other entity, that may already provide access to tools such as 3D printers.

A further issue is that learning to use a 3D printer and the surrounding software and technologies may be more difficult or complex than necessary or may take a longer time or more effort to learn than is available or dedicated to learn. Various embodiments contemplate that users would not need to understand all of the inner workings of a 3D printer in order to create an object.

A further issue is that designing parts often require skills that many people may not have. A system enabling a user to easily request or order designs and then subsequently manufacture the designs may be useful.

A further issue is that said organizations or institutions may not be able to effectively offer access to users who may be members or patrons because of the time and effort required for processing manufacturing requests by users, quoting, billing users, and queueing manufacturing instructions for 3D printers owned by said organizations or institutions.

A final issue is that current 3D printers may be built with a software interface designed to be used primarily by a single user rather than a large group of people, which may make 3D printers difficult to share within a large institution such as a university or manufacturing company.

One of the possible benefits as discussed in the present disclosure may be to provide solutions for some or all of these problems by creating a simple online interface for manufacturing, such as 3D printing, and using apparatuses, such as reliable 3D printers, to create objects for a community of users.

Illustrative System

Various embodiments contemplate that the system may be comprised of a web-accessible server which may process designs into manufacturing instructions for creating said designs, a client which may access the server over the internet and receive manufacturing instructions, and an apparatus which may manufacture objects according to instructions provided by the client. Alternatively, the client may not be required and instead the manufacturing instructions may be transmitted to the manufacturing apparatus operator, which may then transmit the manufacturing instructions to the manufacturing apparatus. The server may additionally enable users to share, buy, download, transmit, version, modify, order, view, and otherwise interact with designs. The server may also contain databases of manufacturing apparatus locations and specifications, manufacturing technology parameters, material specifications, and design libraries. This database information may be suitable for creating objects using additive manufacturing, for example, 3D printing and/or subtractive manufacturing techniques. It also may enable users to choose effective manufacturing parameters for their designs, and it may enable the server to create manufacturing instructions used by manufacturing apparatuses such as 3D printers to turn designs into objects. The system may filter or select manufacturing apparatuses according to their suitability for manufacturing a design, which may include associated manufacturing settings, as provided by a user.

Additionally or alternatively, various embodiments contemplate an illustrative system 100 as depicted in FIG. 1. The system 100 may be comprised of one or more servers 101, and/or zero or more computing device interfaces 102, clients 103, operators 104, and manufacturing apparatuses 105. The servers 101 may be able to communicate with the other components of the system via the cloud, the internet, another network, or some other appropriate means of communication. The client 103 may communicate with one or more apparatuses 105 using a computer network, wireless transmissions, or a data cable. Additionally or alternatively, the clients 103 may require human intervention to transmit information between the client 103 and the apparatus 105a. The operators 104, may facilitate communication between the server 101 and one or more apparatuses 105b using a computer network, wireless transmissions, data cable, removable data storage devices, directly programming the apparatus 105b, manual data entry, or another interface present on the apparatus 105b itself. A design 106, or other data such as manufacturing parameters 107, may be transmitted to or from the system using a computing device interface 102, which may be comprised of a human-accessible web application 102a, a mobile application, consoles on the apparatuses 105, or an application programming interface (API) 102b. Apparatuses 105 may be comprised of manufacturing devices, such as 3D printers, which may turn machine instructions produced by server 101 or design 106 sent through server 101 into one or more objects 108 which may correspond with design 106 and manufacturing parameters 107. The server 101 may be able to communicate directly with manufacturing apparatus 105c using a computer network or other means, and either through the API 102b or another interface.

Figure 2:
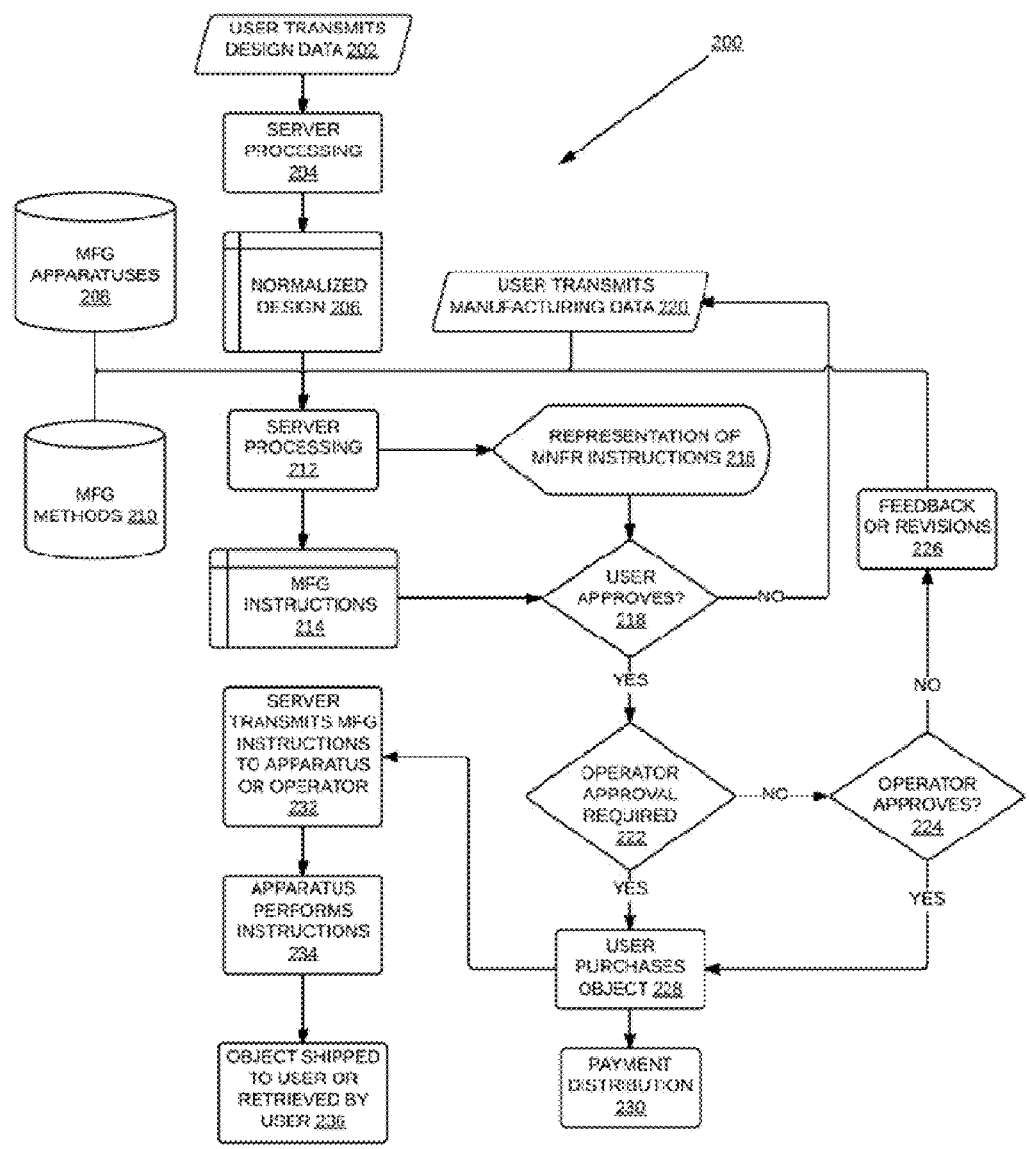
FIG. 2 depicts a flowchart describing an illustrative manufacturing system.
Figure 3:
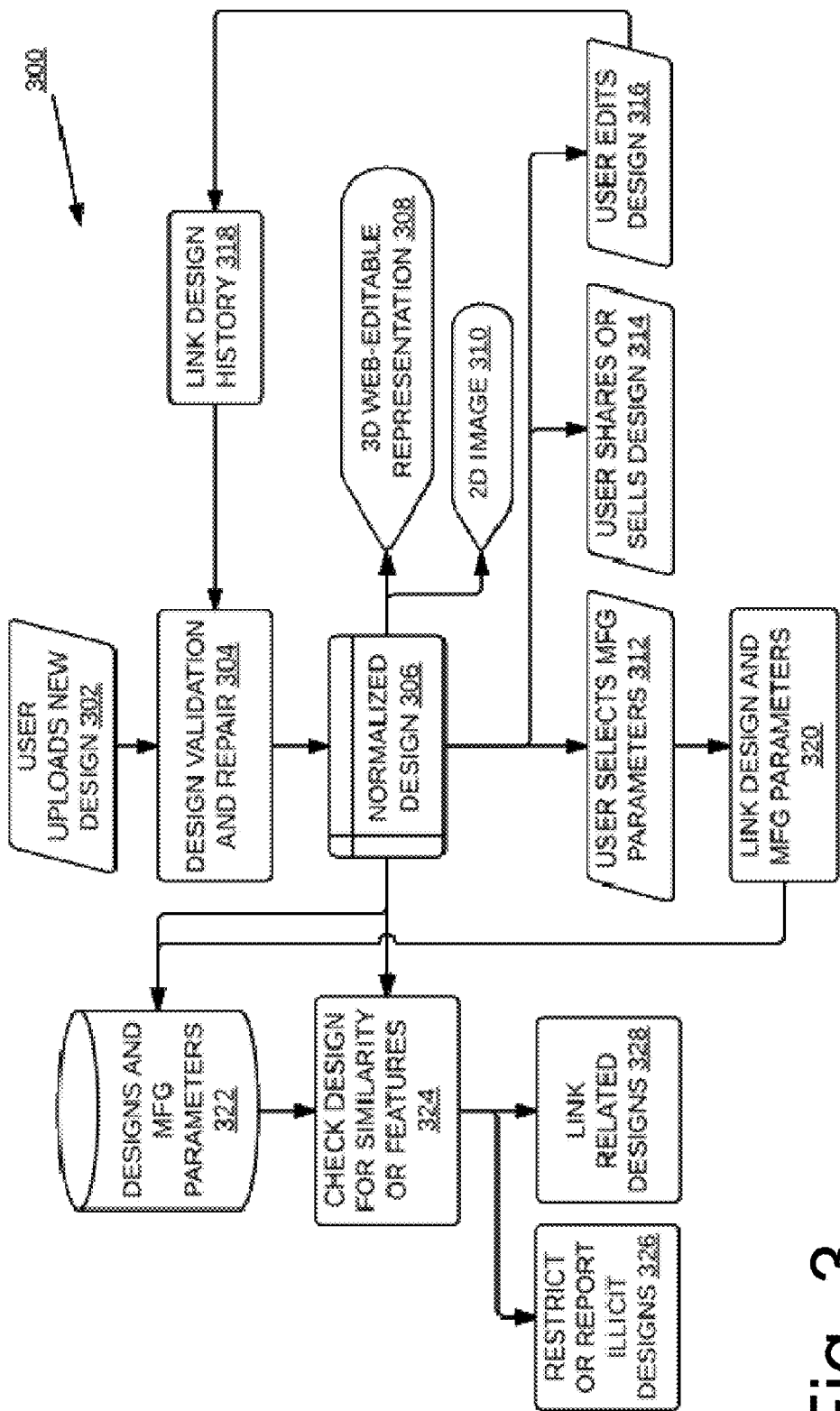
FIG. 3 depicts a flowchart of selected illustrative user interactions with an illustrative manufacturing system.
Figure 4:
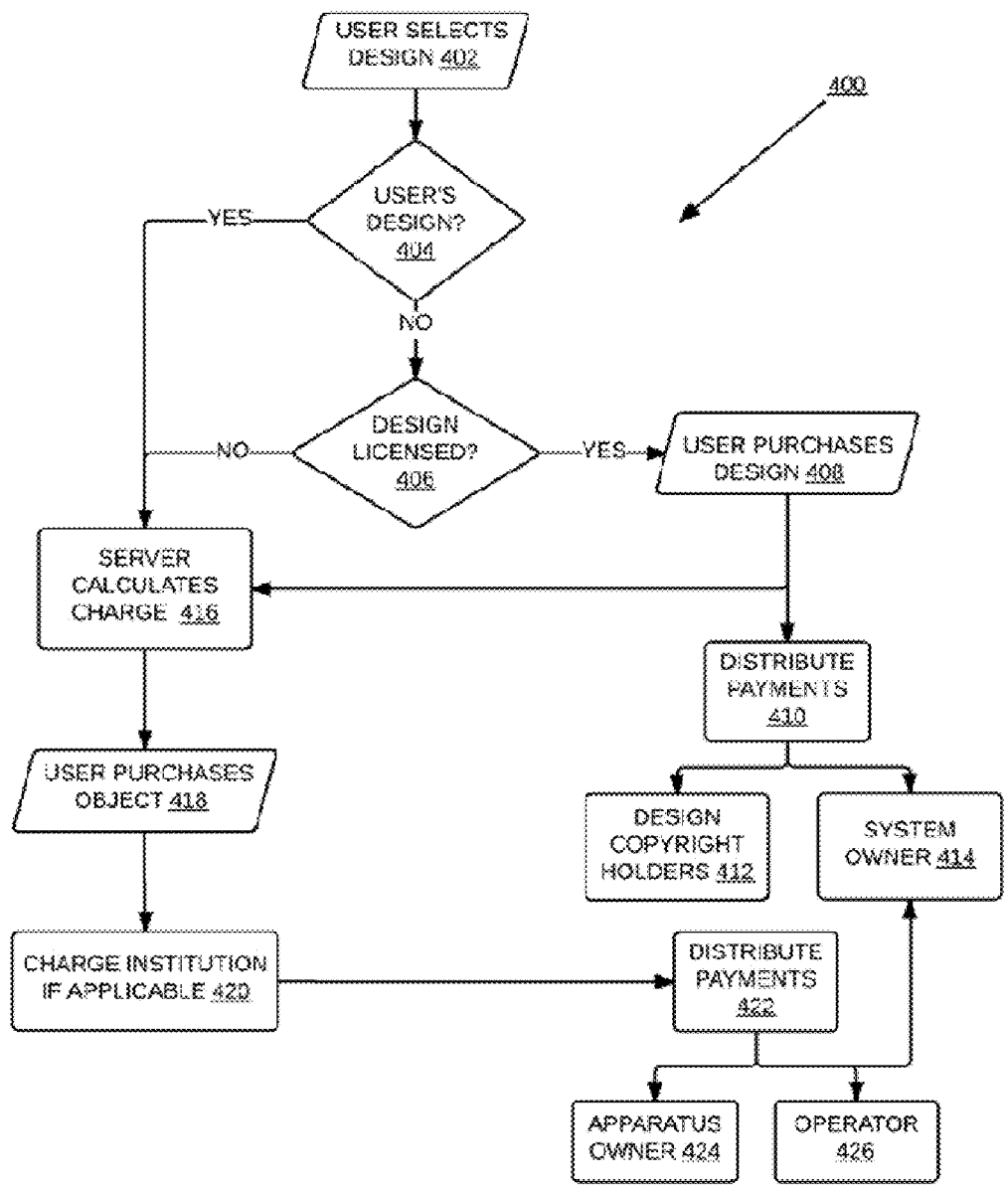
FIG. 4 depicts a flowchart of an illustrative payment processing and fund distribution by the system.
Figure 5:
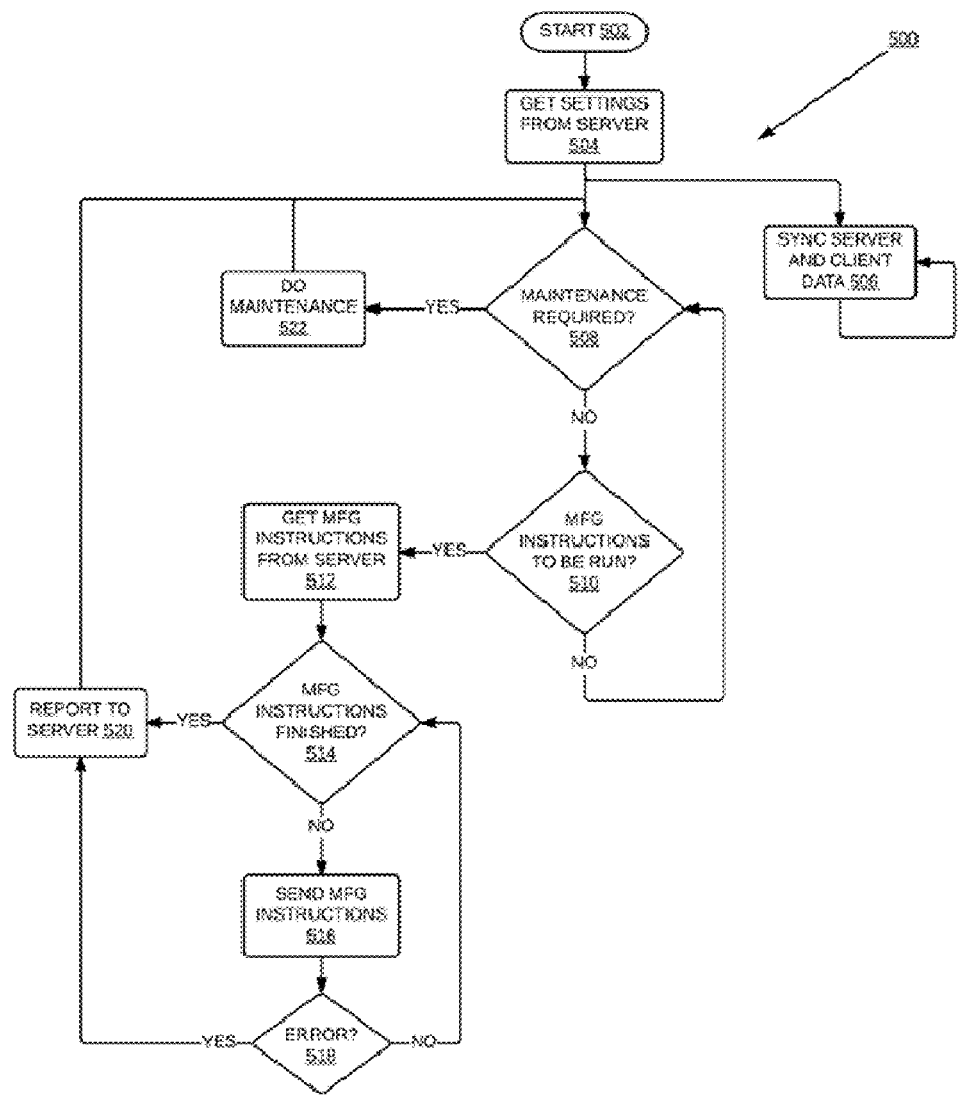
FIG. 5 depicts a flowchart of an illustrative client software operations for manufacturing an object.

Additionally or alternatively, various embodiments contemplate a system which may include features depicted in the flowchart in FIG. 2, or with a user interface on the server which may include features depicted in the flowchart in FIG. 3, or with a payment distribution system which may include features depicted in the flowchart in FIG. 4, or with a client software system which may include features depicted in the flowchart in FIG. 5.

Illustrative Processes

For ease of understanding, the processes discussed in this disclosure are delineated as separate operations represented as independent blocks. However, these separately delineated operations should not be construed as necessarily order dependent in their performance. The order in which the processes are described is not intended to be construed as a limitation, and any number of the described process blocks may be combined in any order to implement the process, or an alternate process. Moreover, it is also possible that one or more of the provided operations may be modified or omitted.

The processes are illustrated as a collection of blocks in logical flowcharts, which represent a sequence of operations that may be implemented in hardware, software, or a combination of hardware and software. For discussion purposes, the processes are described with reference to the system shown in FIGS. 1 and 5-7. However, the processes may be performed using different architectures and devices.

FIG. 2 is a flowchart of an illustrative process 200 of an illustrative manufacturing system. At 202, design 106 may be transmitted to the system. The transmission may be from a user, a database, a software routine, another system, or combinations thereof. This design data may comprise information about the object to be manufactured, and/or more detailed instructions for manufacturing the object. The information may be formatted to adhere to already developed standards for storing 3D information such as STL, AMF, OBJ, IGES, STEP, SLDPRT, GCODE formats or others. The information may be a 2D standard such as SVG or PDF. The information may be a description such as a written description, a hand-drawn sketch, or a 3D scan of an actual object. Additionally or alternatively the design data may be a combination of one or more of the previous formats, or a yet-undeveloped format. Additionally or alternatively, the user may transmit the design 106 by uploading a file, sending the information via email, or some form of electronic communication other than interface 102a.

At 204 the server 101 performs processing on the design data 106. The processing may comprise file conversion, size limiting, mesh repair, orienting, scaling, or other appropriate processes. The processing may be a combination of one or more, or none of these processes. For example, a user may upload an IGES file to the server 101. The server may convert this file to an STL format. Or the user may have uploaded an STL file that was non-manifold and the server may repair the file so that it is manifold. These processes may be done automatically, or at the behest of the user, or the server 101 may ask the user for permission to perform the one or more of the processes. The server may provide feedback to the user on the progress and/or results of server processing 204.

The result of these processes may be some normalized design 206 which may be stored in a database. The design may be made accessible to other users of the system, the public, or some combination or subset thereof. Or the design may be kept private. Additionally or alternatively the design may be licensed or copyrighted. The design 206 may be combined with information about manufacturing apparatuses 105 stored in database 208 and information about manufacturing technologies or methods stored in database 210 and manufacturing data 220 and processed by server processing 212. One result of this processing 212 may be the manufacturing instructions 214, and another may be a representation of the manufacturing instructions 216

Information about manufacturing apparatuses 105 stored in 208 may be contained in a database or some other system. Information about a manufacturing apparatus 105 may comprise location, ownership, availability, operating hours, technology, manufacturing instructions format, communication protocols, capabilities, tolerances, sensor measurements, status, configuration, errors, user feedback, required maintenance, operating costs, or other pertinent information. This information may be transmitted to the server 101 by the manufacturing apparatus 105b or 105c or a client device 103 or an operator 104 or some combination thereof. Additionally or alternatively, the server may generate additional information related to manufacturing apparatuses 105 by combining one or more of the pieces of information provided.

Information about manufacturing methods stored at 210 may be contained in a database or some other system. Manufacturing methods may be a single manufacturing process such as 3D printing or CNC machining or some combination thereof. Information about a manufacturing method may comprise technologies, capabilities, tolerances, resolution, cost, speed, manufacturing instructions format, or other pertinent information.

The manufacturing data 220 may comprise manufacturing parameters 107 and/or additional data on how a user may wish for a design to be manufactured. For example, this data may include a material or variety of acceptable materials, a color or range of acceptable colors, a dimensional tolerance specification, a specification to use a particular manufacturing apparatus 105c or a set of manufacturing apparatuses 105a and 105b. The server 101 may combine design data 202, manufacturing apparatus data 208, manufacturing method data 210, and manufacturing data 220 in server processing 212. One result of this processing 212 may be a description of the available manufacturing options that may match some or all of the data sets 208, 210, 202, and 220. The server 101 may present this description, which may include suitable apparatuses 105, manufacturing pricing, manufacturing location, manufacturing scheduling, and other relevant results of processing 212 to the user for approval or alteration.

The server processing 212 may result in a set of manufacturing instructions 214 that may be suitable for manufacturing an object 108 corresponding to design 106 and manufacturing parameters 107 at one or more apparatuses 105a. The form of the manufacturing instructions 214 may be a file in a standardized format such as GCODE or X3G that provide detailed instructions for the manufacturing apparatus 105a. Additionally or alternately, the manufacturing instructions 214 may take the form of one or more files representing 2D slices or sections of the design 106 or any other form suitable for manufacturing the design 106, such as the design 106 itself. The manufacturing instructions 214 may be represented or transmitted as a stream of information and/or as one or more files. Additionally or alternatively the server processing at 212 may output a representation 216 of the manufacturing instructions 214. This representation may comprise a manipulable 3D representation, a set of 2D slices or sections, an animated preview, or any other representation which may convey processes that may be used by apparatuses 105 The manufacturing instruction representation 216 may be transmitted or displayed over the web or a network, and may be a simplified, pictoral, analogous, or transformed version of the manufacturing instructions 214. The user may inspect the manufacturing instructions 214 or the representation 216 in a web browser or by downloading them and viewing them on their own device or by another means.

At 218, a user may be presented with additional information about the manufacturing instructions such as cost, time required, feasibility, or other pertinent information. The user may decide the manufacturing instructions 214 or some other information such as cost is not satisfactory in some way and so they may choose to submit new manufacturing data 220 and generate new manufacturing instructions 214. Or the user may approve of the manufacturing instructions 214 or the manufacturing representation 216.

At 222, if the apparatus 105 selected requires operator, staff member, or owner approval, the manufacturing instructions 214, representation 216, manufacturing data 220, or other data may be made available to the operator, staff member, or owner of apparatuses 105 for approval at 224. The operator may provide feedback or revisions 226 on the design or manufacturing parameters. The server 101 may process this feedback or revisions 226 and create new manufacturing instructions 214 or a new representation 216. The server 101 may notify the user of the feedback or revisions through an interface 102a or other means such as an email or text message. Additionally or alternately, the server 101 may permit the user to inspect and/or approve the feedback or revisions 226, the revised manufacturing instructions 214, and/or the revised representation 216. This process of feedback or revisions 226 may continue until both the user and the operator have agreed on all relevant parameters.

Additionally or alternatively the operator may approve the manufacturing instructions 214, the representation 216, or the design 202 at the approval step 224. Additionally or alternatively, operator approval may not be required by certain operators or apparatuses 105, and after user approval 218 a user may be permitted to order and/or purchase the specified object 108 at the purchase step 228. The purchase step 228 may require a user to pay using a credit card, cash, electronic token, print credit, or other currencies or means. The server may handle the payment distribution at 230. Further details of payment distribution may be seen in FIG. 4. If the purchase price is negligible or the operator has chosen not to charge the user, the purchase step 228 may not be required. If a user has completed the purchase step 228 or otherwise caused an object to be ordered, the server 101 may add the object to a queue representing a set of manufacturing orders.

Either immediately after an order is made, or after time has elapsed, or after an order queue has been emptied, or upon any other conditions suitable to the operator, user, or system, the server may transmit manufacturing instructions 214 to one or more manufacturing devices 105. This transmission 232 may be completed through a client 103 to apparatus 105a, through an operator 104 to an apparatus 105b, or directly to an apparatus 105c. This transmission 232 may be accomplished by sending one or more files representing manufacturing instructions 214 to the apparatus 105 or by streaming data to the apparatus 105. The transmission 232 may be encrypted to prevent interception or otherwise regulated or protected. The manufacturing apparatus 105 may perform the instructions in operation 234 and may communicate with the server 101 regarding its status, its progress through the instructions 214, and/or other pertinent information. The object 108 may require various finishing, post-processing, or other steps. The object may be shipped to a user, retrieved by the user from the apparatus 105, or given to the user or another party by any suitable means.

FIG. 3 is a flowchart of an illustrative process 300 of an illustrative user interaction with a server. At 302 a user may upload a design. The design may be in a similar format to 202 and it may be transmitted to the server by similar means. Additionally or alternatively, the user may create a design on a webpage provided by the server. The server may perform design validation and repair at 304 such as checking for thin cross-sections, size limitations, or repairing STLs with repeated vertices, or converting the design to a specified format. This may result in a normalized design 306.

At 324 the normalized design 306 may be checked against other designs in database 322 for similarities or common features. Designs that are similar or share common features may be linked or categorized at 328. Linking the designs may enable or searching for related designs. Designs that were similar to or shared common features with illegal, illicit, copyrighted, or licensed designs may be restricted, prohibited, or reported by process 326. The system may notify relevant parties such as copyright holders of potential matches, and/or the system may automatically remove problematic designs.

The design 306 may also be used to create a 3D web-editable representation 308 or a 2D image 310. The representation 308 may be modified at 316 by scaling, rotating, or performing other operations common to designs of the same type as 306. The server may keep track of the modifications to design 306 at 318. The user may share or sell the design 306 to other users of the system or 3rd parties at 314. Or the user may select manufacturing parameters at 312 which are linked with the design at 320 for later retrieval from database 322.

FIG. 4 shows an illustrative payment distribution system 400. At 402 the user may select a design available on the system 100. The design may come from the user, another user of the system, or some other source available to the system 100. At 404 the server checks if the design is owned by the user or the user has permission to use it. At 406 the server checks if design is licensed, copyrighted, or otherwise requires payment for use. If the result of checks 404 and 406 are such that the server has determined that payment is required for the user to use the design, the user may purchase permission to use the design at 408. This purchase may give the user restricted or unrestricted access to the design. Restricted access may imply that the user may only use the design a limited number of times or that the design is not made available to download by the user. At 410 the design purchase payment may be distributed to the design copyright or license holders 412 and/or the system owner 414.

If the user has permission to use a design or has purchased permission to use a design the server 101 may calculate the cost at 416 to have the design manufactured. The server may calculate cost based on the user, user's credit, the manufacturing parameters, the manufacturing apparatus, the institutions the user is a member of, the operator of the apparatus, the owner of the apparatus, or a combination of these and/or other factors. For example, if the user owns the manufacturing apparatus there may be no cost. Or if the user is a member of a certain institution or user group the cost may be discounted. The user may choose to purchase the manufacture of the design at 418 at the price calculated at 416. At 420 the institution the user is a member of may be charged. For instance, an employee at a specific department inside a company may incur a charge for that particular department or company upon purchasing an object within the system. At 422 the payments from the user and/or the institution are distributed to the apparatus owner 424, the apparatus operator 426, the system owner 414, or some combination thereof.

FIG. 5 shows an illustrative process 500 that software running on client 103 may use. The process starts at 502 which may be turning on or supplying power to the device, or opening or starting an application. At 504 the client may retrieve settings from server 101. These may be settings that the client needs to communicate with or control apparatus 105a such as baudrate for serial port communications, or settings for how the process 500 should run, or settings chosen by the server, owner, or operator. The software may start a thread, process, or subprocess 506 which keeps information between the server and the client synchronized. Process 506 may comprise the client transmitting information such as completed tasks, client status, apparatus status or sensor measurements, warnings, or alerts such as low feedstock to the server 101. Additionally or alternatively, process 506 may comprise the server sending information such as settings, tasks, or alerts such as pending or waiting tasks to the client.

At 508, the software may check if maintenance is required. It may check its own internal or external memory, communicate with the apparatus 105a, or communicate with the server 101 to determine if maintenance is required. If maintenance is required it may perform the maintenance at 522 such as a software update. Additionally or alternatively, the maintenance required may need operator input such as pressing a button on the client 103 or loading feedstock into the apparatus 105a. In this case, the software may wait at 522 until an operator can perform the required operations.

At 510 the software may check if there are pending manufacturing instructions to be run. Pending manufacturing instructions may come from the server, or the user interface on the client. If the manufacturing instructions are stored on the server the software may download or otherwise retrieve them at 512. At 516 the software may transmit manufacturing instructions to the apparatus 105a until there is an error at 518 or the manufacturing instructions are finished at 514. Errors at 518 may be a software error, or feedstock depletion, an error issued by the manufacturing apparatus or any other related problem. At 520 the software may report back to the server the result of the manufacturing instructions such as success or failure. Additionally or alternatively the software may report back any errors or problems encountered to a user or operator through a client user interface.

Additionally or alternatively the subprocesses outlined in FIG. 5 may be run in parallel or serially within one process or some combination thereof. Furthermore, the manner in which process 500 is outlined is not meant to limit the scope of what is claimed.

Illustrative Manufacturing Instructions

Various embodiments contemplate apparatuses comprising CNC machines, such as CNC mills and/or CNC lathes, such that manufacturing instructions may comprise steps including, but not limited to, locating or indexing feedstock material, e.g. an aluminum billet, selecting and indexing various machining tools, e.g. end mills, selecting various manufacturing parameters, e.g. feed rates and spindle speeds, and manufacturing the object by removing material from the feedstock material to create the object.

One common method of encoding manufacturing instructions for CNC machines is GCODE, which may be comprised of lines of commands specifying specific machine operations. For instance the command "G28;" may command a machine to move components along certain axes until they have reached their "home" position, while the command "G0 X0 Y0;" may command a machine to move a tool or end effector to the location (0,0) in the XY coordinate system.

While GCODE is a common means of controlling manufacturing apparatuses, there are many other viable options, including sending direct motor or axis commands to the apparatus, sending higher-level commands representing larger subsections or slices of an object to the apparatus such that it may perform some of the processing necessary to create manufacturing instructions internally, or using another communication standard than GCODE, whether that standard is proprietary, or machine-dependant, or a yet-undeveloped standard, or a representation of the manufacturing object as vectors or bezier curves, e.g. SVG files, or an encrypted format, plain text, or binary standard, or based on JSON or XML, or other various options.

Additionally or alternatively, various embodiments contemplate apparatuses comprising 3D printers, such that manufacturing instructions consist of steps for building an object additively from one or more feedstock materials. The instructions may consist of GCODE or other standards such as proprietary communication methods.

Various embodiments contemplate manufacturing parameters and/or manufacturing parameter sets which may be shared, transmitted, or modified among users of the system and/or third parties. These parameters may be required or optional, and may include settings such as manufacturing material or color, and/or specifications for the presence or absence of supports and/or separate support materials for 3D printing, the density and/or pattern for the interior of an object, or other specifications suitable for 3D printing and/or other manufacturing technologies.

Many various types of GCODE may exist for controlling 3D printers. Thus the system may create manufacturing instructions based on GCODE variant "languages" specific to a particular make, model, or software version of 3D printer. Even within a specific GCODE variant, some commands may only be suitable for certain makes, models, or particular hardware configurations of 3D printers. For instance, different 3D printers may have fans of varying strength and configuration, and while the same command may operate fans similarly on multiple printers of the same make and model, the correct fan setting may be specific to a particular 3D printer or printer configuration.

Thus the system may produce manufacturing instructions matching particular hardware configurations of manufacturing apparatuses, and it may provide an interface such that users and third parties can use to create, store, or transmit manufacturing parameter sets matching particular manufacturing apparatus hardware or software configurations. The system may also provide features for validation of manufacturing parameter sets to ensure or guarantee that a particular design with a particular manufacturing parameter set may be manufactured correctly by one or more apparatuses within the system.

Illustrative Locations: Local or Remote Manufacturing Apparatuses

Various embodiments contemplate the manufacturing apparatus situated close to the users such that it may be convenient for users to retrieve objects from an apparatus directly or from the operator of the apparatus.

Alternately, other embodiments contemplate manufacturing apparatuses that may not be located near the user. In this case, the object may then be shipped to the user by the operator or owner of the apparatus, by the user, or by a third party.

Illustrative Third Party Apparatuses and Software

Various embodiments contemplate apparatuses designed or manufactured by the same party that designs or manages the system.

Additionally or alternatively, various embodiments contemplate that the apparatuses or clients may be provided or manufactured by one or more third parties, e.g., third-party manufacturers of 3D printers. In these embodiments, the system may contain manufacturing parameters corresponding to various apparatus makes or models. The apparatuses may also be supplied by users themselves, e.g. hobbyists building their own 3D printers.

In various embodiments the system may allow third parties such as manufacturers or hobbyists to specify their own manufacturing parameter setsfor certain makes or models of apparatus. The system may permit users or other parties to link or otherwise add or attach their own algorithms or processes for modifying designs or for translating designs into manufacturing instructions, such that users of the system may be able to utilize these third-party algorithms or processes, for instance when translating their designs into manufacturing instructions.

Illustrative Design Features

Additionally or alternatively, various embodiments contemplate that the server may provide features for users to view and modify their designs, such as an in-browser design editor, or the ability to download one version of a design, or upload a newer version of a design. The server may link related designs to provide a design history to simplify management of the designs for the users, or to simplify sharing and updating a design among multiple users or parties.

Additionally or alternatively, various embodiments contemplate that the server may link designs with additional information such as manufacturing parameters or instructions, or such as access or licensing restrictions for a particular shape. For example, a group of related designs may be linked together into a project, which may also include example photos and descriptions of the designs or their assembly. Thus the server may enable users to easily share, sell, or otherwise distribute designs in such a way that the recipients also receive this linked or coupled information, which may be useful to manufacture various objects effectively. In instances where this distribution happens between users of the apparatuses or methods of the present disclosure, the server may keep linked information updated for both parties when either party modifies it.

Illustrative Design Searching, Ordering, or Bidding

Additionally or alternatively, various embodiments contemplate features enabling users to obtain designs or manufacture objects from designs that they did not transmit to the server themselves. For example, many users may not wish to create their own designs. The server may enable them to search for existing designs that suit their needs by filtering design information such as licensing, name, shape, tags, and/or other metadata. The server may restrict the search to designs contained within the system, or it may include external libraries, services, or websites which may have additional suitable designs. If the user finds a suitable design, the server may enable them to access the design with certain limited permissions. For instance, the server may permit the user to view the design, to order a limited number of manufactured objects based on the design, to share the design with others, to modify the design, and/or to download the design.

In situations where a user might not be able to find an appropriate design this way, or in other situations, the server may enable the user to place a request or order with another party, such as another user or a set of users of the system, to create an appropriate design. This order may be public to many users of the system, or it may only be visible to a selection of users. The server may also provide a bidding, rating, or reputation system for users such that multiple users can bid on a particular design request or design order, and that the user requesting or ordering a design may choose from a selection of bids by bid cost, user reputation, or other filters.

The system may provide standardized contracts, payment plans, refund processes, licensing agreements, and/or design packages associated with these bids, requests, or orders. These may be used to facilitate the purchase or sharing of designs, such as in cases where a user may want another particular user to create a design on their behalf.

Illustrative Design Matching

Additionally or alternatively, various embodiments contemplate that the system may automatically match new or modified designs against databases of designs or design features. This ability may be useful for detecting designs that infringe licensing restrictions, trademarks, or other restrictions. The system may flag and lock any such designs for more detailed evaluation to ensure that the system is not used for illegal or undesired purposes. The system may accomplish a matching or comparison of designs by comparing design metadata, design files, or by comparing the shapes of the designs directly, e.g. by normalizing all designs to a particular size and orientation according to their principal axes of moments of inertia or other means, or by running a potentially weighted volumetric comparison between regions of sets of shapes to determine similarities between the shapes.

By way of example only, an algorithm may normalize designs by scaling and orienting them somewhat deterministically such that normalized designs have approximately the same volume and such that design coordinate axes are aligned with design principle axes of inertia, assuming a constant object density. The algorithm may then find sets of points chosen at random or from an evenly spaced grid of points inside of the set of normalized designs being compared. The algorithm may then compare the sets of points contained by each of the normalized designs being compared, e.g. when comparing a regular grid of points in the designs, a particular point or set of points being located within both normalized designs may tend to increase the likelihood that the designs are related, while the existence of a particular point or set of points within one normalized design but not within another may tend to indicate that the two designs may not be related.

Illustrative Design Validation, Feedback, and Repair

It may be possible for users to select a combination of design and manufacturing parameters that may not result in a satisfactory object, for instance because the design requires manufacturing tolerances not feasible with a particular manufacturing technology.

The system may reduce the possibility of this occurring by filtering a design and/or manufacturing parameter set for known problems or problematic combinations, or by comparing these settings with previously attempted manufacturing instructions which were reported by users or other parties to fail.

The system may also build a database of such manufacturing failures and solutions so that it may provide automated or semi-automated feedback to users recommending improvements to the design or manufacturing parameters.

It may also be possible for users to create and transmit poorly formed designs to the system. The system may validate or reject designs in order to reduce the frequency of malformed designs. In certain circumstances, such as a non-manifold mesh representation of a design, the system may be able to recognize the problem with a particular design and recommend particular actions the user could take to remedy the problem.

In some cases, it may be possible for the server to automatically perform repair of a malformed design or invalid manufacturing parameters. In these cases, the server may notify the user of the recommended change and allow them to test or undo the change, or it may automatically perform certain repairs or modifications without notifying the user. By way of example only, some mesh representations of a design may have doubled vertices or may be non-manifold, and in some cases an algorithm may be able to remove doubled vertices or repair the non-manifold mesh to a manifold state.

As another example, certain designs may have very thin sections that cannot be manufactured with particular manufacturing parameters or technologies with larger minimum feature sizes than the thin sections. The server may be able to recognize incompatibilities or problems such as these and automatically modify the design to solve the problem. In the case of thin sections, for example, the server may perform a Minkowski sum of the design and another object, e.g. a small cube or sphere on roughly the same order of magnitude of scale as the minimum feature resolution, such that the resulting sum design has features large enough that the object can be printed with the chosen manufacturing settings.

There are many additional situation where automated or semi-automated design modifications or repairs which may pertain to particular manufacturing settings or technologies may be useful, such as changing design dimensions to account for manufacturing tolerances or errors, rounding sharp corners, rotating designs for optimal geometry during manufacture, etc. The design and manufacturing parameter validation need not be automated, however. For example, the system may also permit a third party such as the owner of a manufacturing apparatus to validate or modify designs and/or manufacturing parameters that users wish to manufacture using said owner's apparatuses. Additionally or alternatively, the system may enable an owner or operator to communicate with a user on recommended changes to a design or manufacturing settings through a dialog within the system such that all parties reach an agreement on the correct design and manufacturing settings.

Illustrative API

The preceding descriptions describe one or more users of the system, but this does not necessitate that the users are human. The system may also be accessed automatically by an Application Program Interface (API), for example a web API, or other programmatic means. Thus the system may be controlled programmatically by other web services, scripts, or programs such that third parties may programmatically upload designs, configure and order manufactured objects, monitor additive manufacturing apparatuses, or utilize other functionality of the system.

Illustrative Fund Distribution

Additionally or alternatively, various embodiments contemplate providing an efficient payment platform to distribute funds to multiple parties. For example, one user (the purchaser) may have submitted a request for a particular design. Another user (the designer) may have submitted a bid to create the design. If this bid is accepted and the purchaser then orders the design on a particular manufacturing apparatus owned by one party (the operator) and placed on the premises of another party (the institution), multiple automatic payments may occur.

The system may receive funds from the purchaser, whether directly or through a third-party payment processor. The system may then automatically disburse funds to multiple parties: to the designer according to the bid terms, to the institution according to agreements between the operator and the institution, and to the operator. The operator may thus take a cut of all financial transactions occurring on the system, and may also receive payments in one form and disburse funds in another. For instance, for the transaction described above, the operator may receive a payment for manufacturing an object in US dollars, but may compensate the designer through alternate means, e.g. print vouchers or credits, and the institution through a manufacturing credit or discount.

The funds transferred or held by the system may or may not represent a national currency such as the US dollar. They may represent a digital currency such as bitcoin, or they may be converted between multiple types of currencies, or they may use third party payment platforms such as Paypal or Stripe.

Illustrative Entities: Universities

The payment platform may allow for multiple types of business arrangements with various parties. For instance, if the apparatus is placed at a university department, students may purchase designs or manufactured objects using personal funds, or they may order designs or manufactured objects for particular university classes using a credit provided by the university within the system. The university may collect funds from students or other users or customers, and may disburse these funds or other forms of compensation to other parties, such as a particular student operating the university's manufacturing apparatuses or performing routine maintenance or repairs.

Since the payment platform may have information regarding the manufacturing apparatus, it may handle other payments and maintenance. For instance, it may automatically order replacement feedstock from a third party, ship the replacement feedstock to an apparatus owner or operator via email that maintenance should be performed on the manufacturing apparatus. The platform may also notify the operator or advocate of additional apparatus information such as unplanned maintenance requirements or breakdowns.

Illustrative Entities: Private Operators

Additionally or alternatively, various embodiments contemplate an arrangement in which an operator purchases or leases access to a system or one or more apparatuses.

For example, a commercial real-estate owner or tenant (the operator) may purchase, lease, or otherwise arrange access to a manufacturing apparatus and/or the system such that he or she may install a manufacturing apparatus at a commercial location, e.g. a makerspace, a hackerspace, a mall, a shipping or freight provider, or an office supply store. Thus visitors or customers at the commercial location may pick up, design, or order manufactured objects. The operator may distribute funds from the sale of 3D printed goods to other parties, such as the manufacturer of the apparatus or system.

The operator may also encapsulate the system within their own software interface or implement the system on their own hardware. This may allow the operator to provide a user interface with their own branding and/or to operate the system on a network other than the internet, e.g., a corporate intranet or virtual private network. This may be useful or required in cases where contracts or legal restrictions may prohibit or restrict the transmission of certain pieces of information such as classified designs.

In various embodiments where the users of the machine are customers or visitors at the operator's commercial location but otherwise unaffiliated with the operator, the operator may charge them for manufacturing parts on a per-part, per-volume, or other basis.

In various other embodiments, such as if the users of the machine are affiliated with the operator as employees or subcontractors, the users may be permitted to manufacture parts without any per-part charges. Additionally or alternatively, the operator may pay the manufacturer of the system an ongoing fee, a maintenance fee, a feedstock fee, a per-part or per-volume fee, or other sorts of fees.

Third Party Apparatuses

Additionally or alternatively, various embodiments contemplate other arrangements in which an operator may purchase, lease or otherwise arrange access to part of the system, comprising the server, or the server and client, but provide one or more manufacturing apparatuses separately. During operation the apparatus may receive instructions from the client, although the client may be physically internal or external to the apparatus. In various embodiments, these instruction may come in the form of GCODE (a standardized CNC language) via USB port. Those skilled in the art will appreciate that wifi, LAN, USB memory stick, or some other similar means may also be used to send instructions.

Illustrative Desktop 3D Printers

In various embodiments, the operators may be non-commercial or hobbyist in nature, or the manufacturing apparatus may be a desktop 3D printer or similar device.

Additionally or alternatively, various embodiments contemplate the client as comprised of a standalone hardware device able to interface with the manufacturing apparatus via a USB, Ethernet, WiFi, Bluetooth, or other electronic means.

The operators may be able to connect their manufacturing apparatus to the system for personal, educational, commercial, or non-commercial use, or they may be able to offer manufacturing services to other users of the system or third parties.

The payments or fees for use of the system may depend on the use. For instance, if a hobbyist uses the system to manufacture a part on their own 3D printer, there may be no charge for use of the system. On the other hand, if another user chooses to use the operator's manufacturing apparatus to manufacture an object, the operator may collect payments for these services through the system.

An operator may be able to advertise or display their apparatus on the system such that other users may find it based on location, operator-selected pricing, manufacturing technology, or other parameters, e.g. by looking at a map of apparatus locations with descriptions of associated parameters for various apparatuses.

Illustrative Separate Client and Desktop 3D Printer

Figure 6:
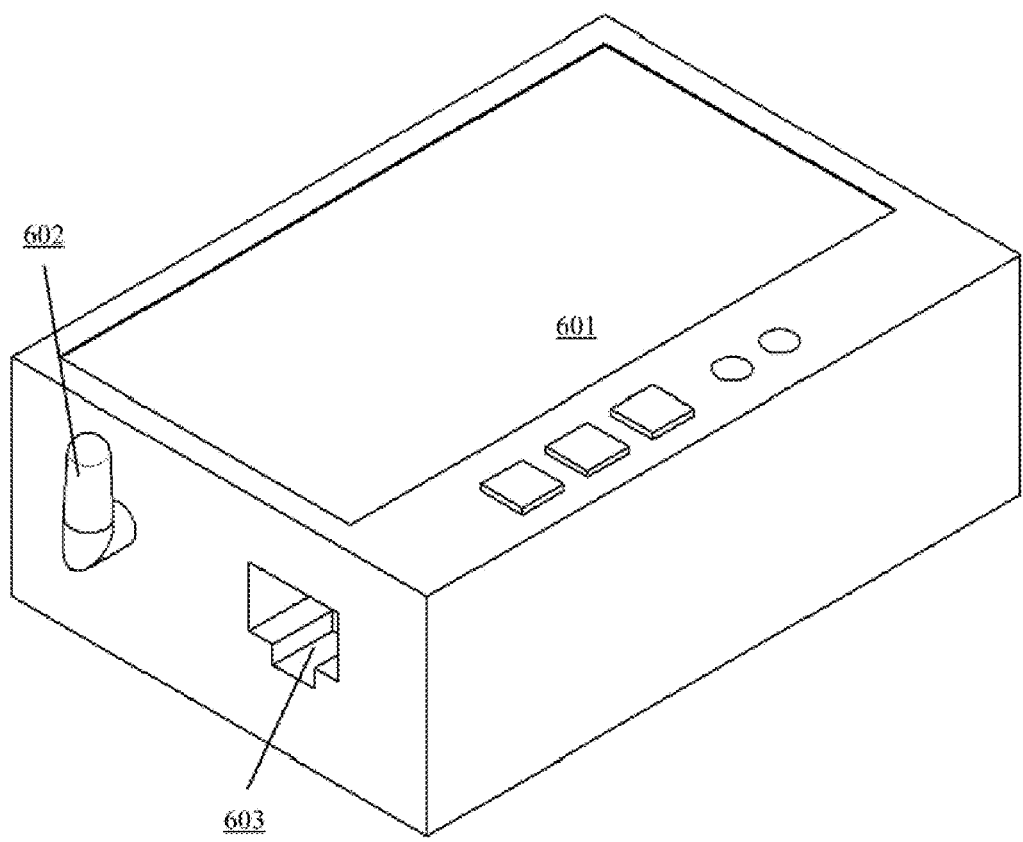
FIG. 6 depicts an illustrative apparatus for manufacturing objects where the client and the manufacturing device are separated physically.

Additionally or alternatively, various embodiments contemplate a client that may be comprised of a small standalone device 600 that may be connected to a manufacturing apparatus such as a desktop 3D printer. The apparatus is shown in FIG. 6 and may contain its own user interface or status indicators.

The device 600 may include a user interface 601 that may contain status indicators representing client states such as connection status with the server 101, connection status with an apparatus 105*a*, and other information. The interface 601 may include buttons that may allow a user to control the client, e.g. a play button that signals the apparatus may begin or resume manufacturing an object, a reload button signaling that additional feedstock such as filament has been or should be loaded into the apparatus, or a cancel button that may allow a user to pause or cancel manufacturing as desired or in cases where the apparatus malfunctions. The user interface 601 may be comprised of multiple separate indicators and/or physical buttons, or it may be a combination of a programmable screen, buttons, and status indicators, and it may include a touchscreen. The user input buttons and status indicators may be comprised of backlighting on said buttons and/or as other backlit areas and/or LEDs and/or the user interface 601.

The device 600 may be connected to a manufacturing apparatus by a data-carrying electronic cable such as a serial cable, USB cable, ethernet connection, etc. The data-carrying cable may be part of the device or it may be connected to a port 603 on the device. Additionally or alternatively, the client device 600 may have a wireless device 602 or have a port for a wireless device that may use a data-carrying protocol such as WiFi or Bluetooth to connect to the apparatus.

The device 600 may also be able to connect to the server 101 over the internet or another computer network. This connection may be facilitated by a port 603 capable of transmitting and receiving electronic data, such as an ethernet port. The connection may be facilitated by the wireless radio 602.

The device 600 may have a client operating software as illustrated in FIG. 5 which may allow it to operate in a fault-tolerant manner, handling issues such as connectivity problems with the server 101 or an apparatus 105*a*, or mechanical issues such as feedstock depletion.

The device 600 may also include or communicate with sensors such as video cameras or filament sensors that may be connected wirelessly through Bluetooth, Wifi, or another protocol, and/or using an electronic cable or wires to the device 600 such that the user, client, and/or server may obtain additional information about the apparatus state. For instance, a filament sensor may be used to notify the device 600 when the apparatus has depleted its filament feedstock. The device 600 may notify the server, and the server may notify the user with an email, text message or other electronic message. If the user replaces the filament feedstock, they may be able to signal this replacement and resume manufacturing by pressing a button on the interface 601, or using a web application or API to communicate with the server. Additionally or alternately, the device 600 may include an optical sensor or video camera such that the server may be sent photo or video information regarding the apparatus state, and users may be able to view this information using the server. The server make take actions based on its analysis of apparatus and/or client data, such as automatically pausing prints and notifying a user or operator when it recognizes an anomalous sensor reading or optical data.

Illustrative Apparatus: Fused Filament Fabrication

Various embodiments contemplate an apparatus 700 comprising an additive manufacturing device that utilizes fused filament fabrication by one or more 3D printing toolheads 701 able to move relative to the build surface and with one or more nozzles capable of extruding feedstock materials. The additive manufacturing device is enclosed by enclosure 702 such that the manufacturing volume may not be accessible to the general public. The enclosure could be a cabinet constructed out of molded sheet metal, glass, fiberglass, plywood, or other suitable materials and construction methods.

In various embodiments the enclosure also may include a container 707. The container 707 may comprise a single compartment or a plurality of compartments. The apparatus also may have an ejector mechanism 704 for moving an object 703 from the manufacturing volume to the container or a particular compartment in the container.

Figure 7:
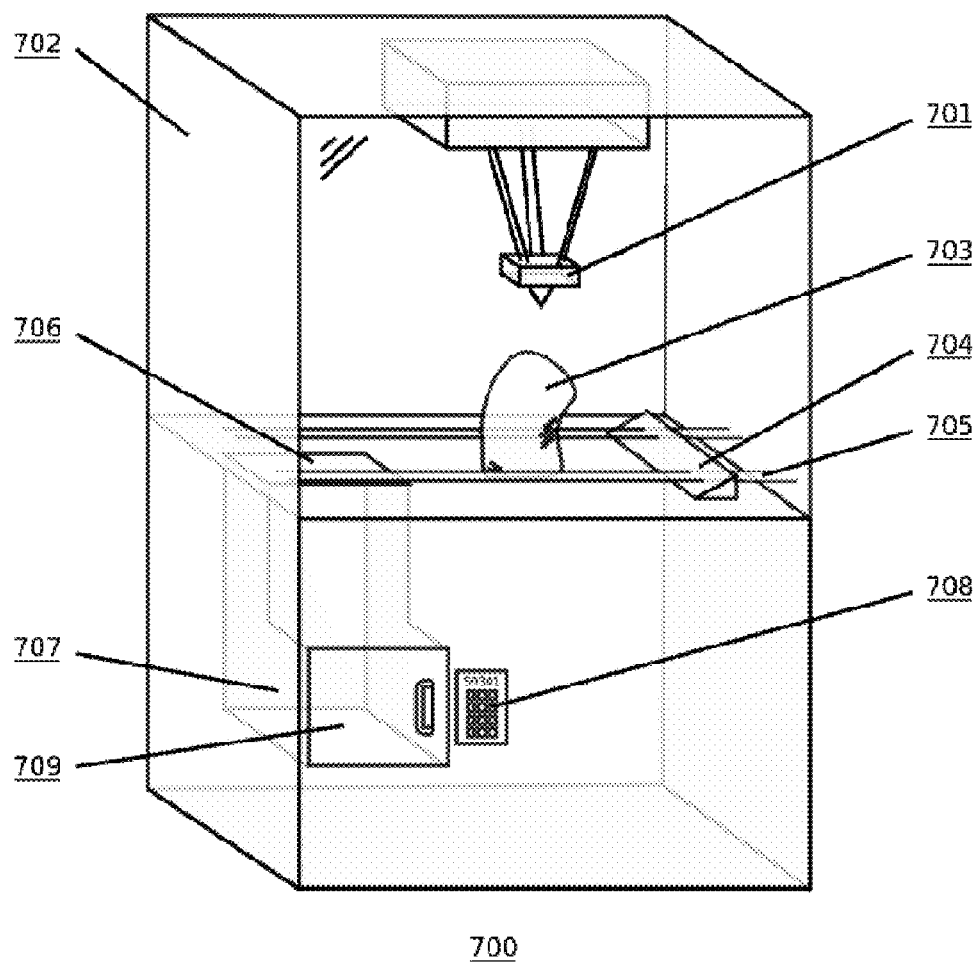
FIG. 7 depicts an illustrative apparatus for manufacturing objects using additive manufacturing.

In various embodiments illustrated by FIG. 7, the ejector 704 may be actuated by one or more leadscrews 705 such that rotation of the leadscrew 705 may cause the ejector 704 to move laterally towards or away from the container opening 706. This motion may be used to dislodge object 703 from the build surface after manufacturing is complete, and drop it through opening 706 into container 707 for later retrieval.

The container 707 may have a lockable door or access hatch 709 such that the correct passcode or authentication may be required on keypad or user interface 708 to retrieve a manufactured object from container 707.

During operation the apparatus may receive manufacturing instructions from the server 101 through a client 103, although the client may be physically internal or external to the apparatus. In various embodiments, these instruction may come in the form of GCODE (a standardized CNC language) via USB port. Those skilled in the art will appreciate that wifi, LAN, or some other similar means may also be used to send instructions. The apparatus may act according to these instructions and perform various operations according to additive manufacturing techniques which result in one or more physical objects 703 being created.

Illustrative Features

The following section discusses non-limiting illustrative features.

In various embodiments, the operators may be non-commercial or hobbyist in nature, or the manufacturing apparatus may be a desktop 3D printer or similar device.

Various embodiments contemplate a remotely-accessible manufacturing system which may receive a software representation of a physical object (the design), translate the design to instructions representing manufacturing steps for the design, and transmit the instructions to a manufacturing apparatus which may follow the instructions to manufacture one or more objects corresponding to the design (the object).

Additionally or alternatively, the manufacturing instructions may be transmitted to a client comprising a stand-alone hardware unit that then transmits the instructions to the manufacturing apparatus. The client may have a user interface, may communicate with the server over the internet, and may control the manufacturing apparatus using an electronic data cable, wireless transmissions, or some other form of communication technology.

Additionally or alternatively, the client may contain or communicate with monitoring devices, e.g. remaining feedstock measurement, camera, temperature sensor, etc.

The system may transmit the manufacturing instructions to the manufacturing apparatus by sending digital instructions over the internet or using other potentially long-range electronic communication technologies. The system may automatically send the manufacturing instructions using an API, email, or other electronic transmission to said manufacturing apparatus owned by a third party. The system may automatically transmit the manufacturing instructions to the party owning said manufacturing apparatus who then pass it to the manufacturing apparatus.

The manufacturing apparatus may use a generally subtractive method of manufacturing such as milling and the feedstock is composed primarily of solid volumes of material such as a metal billet. Additionally or alternatively, the manufacturing apparatus may use a combination of additive and subtractive manufacturing methods.

The manufacturing apparatus may use a combination of additive and surface modification methods, e.g. 3D printing with one or more subsequent steps which may include sintering of the printed object, infiltration of one or more materials into the object, thermal curing, light-catalyzed curing, polishing, surface texturing, or painting.

The manufacturing apparatus may use a generally additive method of manufacturing such as 3D printing and the feedstock is composed primarily of filament, powder, liquid resin, or fibers.

The system may be remotely accessible using a web application, website, or mobile application. The system may be remotely accessible by machine or programmatic methods such as an API.

Additionally or alternatively, the design may be compared with one or more patterns to match or link other designs or patterns. A comparison may include design elements such as name, owner, file type, file characteristics, and/or other design metadata, and/or elements such as constructive solid geometry features, volumetric comparisons, surface comparisons, or feature comparisons. The matching or linking may facilitate building a design history, conserving system resources by eliminating redundant information, determining owners, license holders, or contributors for a design, and/or flagging, reporting, or restricting designs matching undesired patterns.

A remotely-accessible design management system which may receive, store, modify, and transmit software representations of physical objects (the designs), and may transform the designs into manufacturing instructions corresponding to specific manufacturing technologies.

The system may capture user-specified manufacturing parameters for one or more designs, and which may combine said designs with user-specified manufacturing parameters and create said manufacturing instructions suitable for one or more particular manufacturing apparatus types, models, or machines.

A user may cause the system to transmit, store, or receive a manufacturing intent comprised of said design and manufacturing parameters corresponding to said additive manufacturing apparatuses and/or said user-specified parameters.

The users may request or order designs which may match certain manufacturing parameters from other users or third parties. The users may bid for the requests or orders.

Various embodiments contemplate that a system may comprise the design management system and the manufacturing system as discussed herein.

Additionally or alternatively, the system may automatically disburse funds or other payments to multiple parties. Payments may be accepted, processed, or transmitted in multiple forms, such as credit cards, money orders, bank transfers, digital currencies such as Bitcoin, or as vouchers or credits for manufacturing or design services.

Various embodiments contemplate a method for additively manufacturing objects comprising various steps. For example, uploading a software representation of one or more desired objects (the design) to an internet-accessible server. Gathering manufacturing parameters based on optional user-chosen manufacturing settings and/or server knowledge of the selected or appropriate manufacturing apparatuses. Transforming the manufacturing parameters and design into specific manufacturing instructions via the internet. Transmitting the manufacturing instructions to one or more specific manufacturing apparatus(es). Manufacturing the object using said manufacturing apparatus.

The method may further include the step of transmitting said design, manufacturing parameters, or manufacturing instructions between the user and the party owning said manufacturing apparatus(es), during which process the user or owning party may modify the design, manufacturing parameters, or manufacturing instructions. The method may further comprise the step of accepting payment for the design or for the service functionality or for the object on the server or at the manufacturing apparatus.

The method may further comprise repairing design defects and/or converting the design to one or more preferred software representations.

The method may further comprise notifying the end user of manufacturing progress or errors or completion via electronic message such as email or text message.

The method may further comprise transmitting or sharing one or more designs and, optionally, corresponding manufacturing parameter or instructions, with one or more additional users of the system.

The method may further comprise storing the design on the server for viewing, sharing, sending, modification, or exporting the design in alternate formats.

The method may further comprise various steps. For example, modifying an existing design (versioning) such that the modified design may share the same set of permissions, license holders, users, and/or other properties. Storing the new design in such a way that it may be linked with the original design to form a design history such that users may access, modify, or manufacture multiple versions of a design within a particular design history.

The method may further comprise various steps. For example, copying an existing design (forking) in such a way that the modified design may be linked with the original design to form a design history. Storing the new design on said service with a potentially different set of permissions, license holders, users, and/or other properties than the original design, such that users with access or rights pertaining to the forked design may or may not have the same rights, e.g. the ability to modify, the original design.

The method may further comprise setting design permissions or licensing such that it may be viewed, shared, purchased, or modified by the public or by a smaller set of service users or by third parties.

The method may further comprise setting design licenses such that users who interact with the design may be required to agree with the design license.

The method may further comprise communicating with said server using an API or other programmatic means.

The method may further comprise selecting said manufacturing apparatus based on server information. For example, this information may consist of one or more of the following filters or features: apparatus location or proximity; apparatus technology or specific technical capabilities; apparatus feedstock availability or specifications; apparatus suitability for manufacturing one or more designs; apparatus cost for manufacturing one or more designs; apparatus availability or time required to manufacture; and/or apparatus performance based on user reviews.

Illustrative Computing Device and Illustrative Operational Environment

Figure 8:
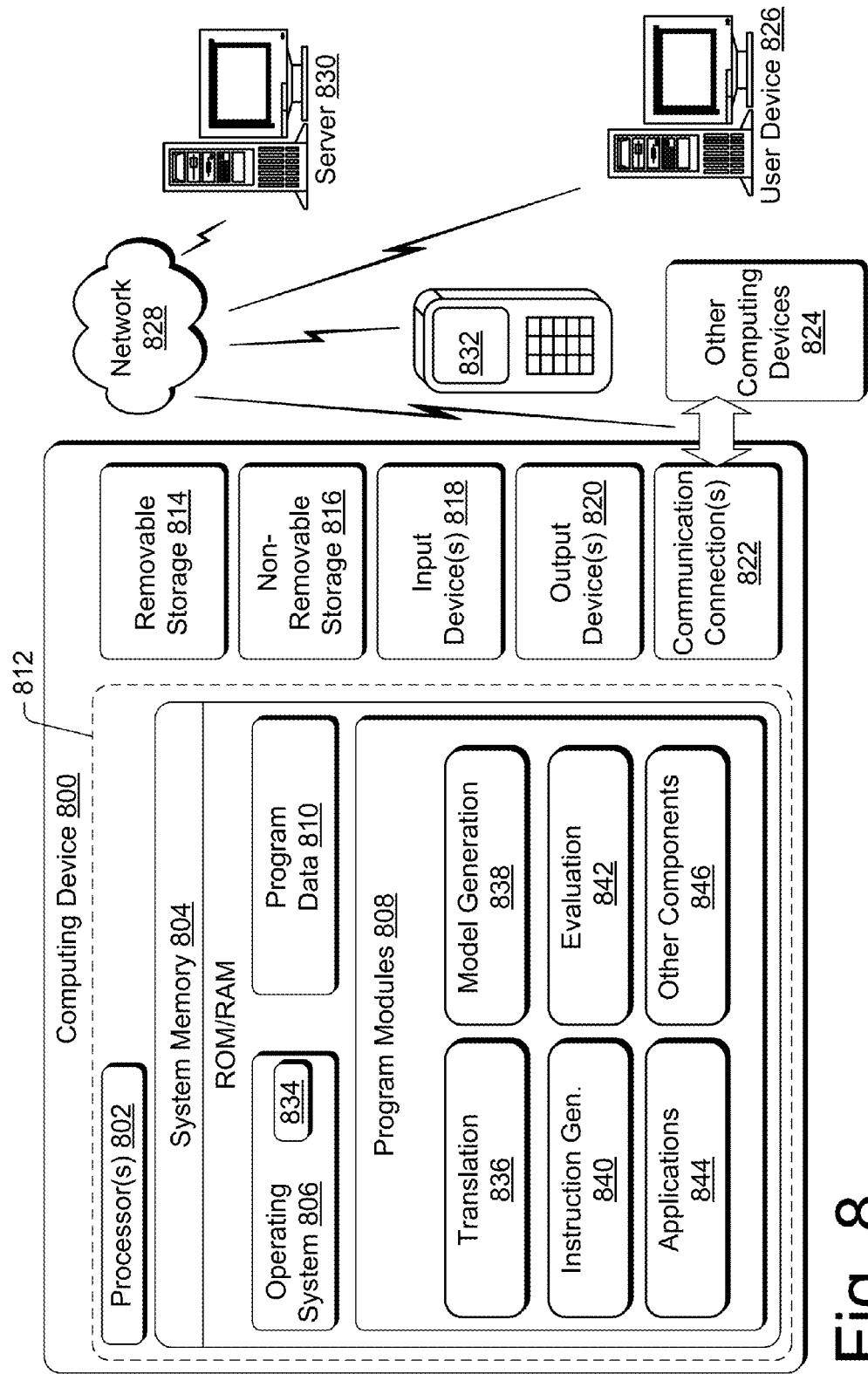
FIG. 8 depicts an illustrative representative computing device and environment.

FIG. 8 illustrates a representative computing device 800 that may, but need not necessarily be used to, implement the system and methods described herein, in accordance with various embodiments. The techniques and mechanisms described herein may be implemented by multiple instances of the computing device 800, as well as by any other computing device, system, and/or environment. The computing device 800 shown in FIG. 8 is only one example of a computing device and is not intended to suggest any limitation as to the scope of use or functionality of any computing device utilized to perform the processes and/or procedures described above.

In at least one configuration, the computing device 800 includes at least one processor 802 and system memory 804. The processor(s) 802 may execute one or more modules and/or processes to cause the computing device 800 to perform a variety of functions. In some embodiments, the processor(s) 802 may include a central processing unit (CPU), a graphics processing unit (GPU), both CPU and GPU, or other processing units or components known in the art. Additionally, each of the processor(s) 802 may possess its own local memory, which also may store program modules, program data, and/or one or more operating systems.

Depending on the exact configuration and type of the computing device 800, the system memory 804 may be volatile (such as RAM), non-volatile (such as ROM, flash memory, miniature hard drive, memory card, or the like) or some combination thereof. The system memory 804 may include an operating system 806, one or more program modules 808, and may include program data 810. The operating system 806 includes a component-based framework 834 that supports components (including properties and events), objects, inheritance, polymorphism, reflection, and provides an object-oriented component-based application programming interface (API). The computing device 800 is of a very basic illustrative configuration demarcated by a dashed line 812. Again, a terminal may have fewer components but may interact with a computing device that may have such a basic configuration.

Program modules 808 may include, but are not limited to, a translation module 836, a model generation module 838, an instruction generation module 840, an evaluation module 842, applications 844, and/or other components 846.

The computing device 800 may have additional features and/or functionality. For example, the computing device 800 may also include additional data storage devices (removable and/or non-removable) such as, for example, magnetic disks, optical disks, or tape. Such additional storage is illustrated in FIG. 8 by removable storage 814 and non-removable storage 816.

The storage devices and any associated computer-readable media may provide storage of computer readable instructions, data structures, program modules, and other data. Computer-readable media includes, at least, two types of computer-readable media, namely computer storage media and communication media.

Computer storage media includes volatile and non-volatile, removable and non-removable media implemented in any method or technology for storage of information such as computer readable instructions, data structures, program modules, or other data.

Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that may be used to store information for access by a computing device.

In contrast, communication media may embody computer readable instructions, data structures, program modules, or other data in a modulated data signal, such as a carrier wave, or other transmission mechanism. As defined herein, computer storage media does not include communication media.

Moreover, the computer-readable media may include computer-executable instructions that, when executed by the processor(s) 802, perform various functions and/or operations described herein.

The computing device 800 may also have input device(s) 818 such as a keyboard, a mouse, a pen, a voice input device, a touch input device, etc. Output device(s) 820, such as a display, speakers, a printer, etc. may also be included.

The computing device 800 may also contain communication connections 822 that allow the device to communicate with other computing devices 824, such as over a network. By way of example, and not limitation, communication media and communication connections include wired media such as a wired network or direct-wired connections, and wireless media such as acoustic, radio frequency (RF), infrared, and other wireless media. The communication connections 822 are some examples of communication media. Communication media may typically be embodied by computer readable instructions, data structures, program modules, etc.

FIG. 8 also shows a schematic diagram of an illustrative operating environment where an illustrative system may operate. For example, various embodiments of the system may operate on the computing device 800. The computing device 800 may interact with a user device 826 directly or indirectly. The computing device may be connected to a network 828. The network device 828 may provide access to other computing devices 824 including a server 830, mobile devices 832, and/or other connections and/or resources. Connections may be wired or wireless.

The illustrated computing device 800 is only one example of a suitable device and is not intended to suggest any limitation as to the scope of use or functionality of the various embodiments described. Other well-known computing devices, systems, environments and/or configurations that may be suitable for use with the embodiments include, but are not limited to, personal computers, server computers, hand-held or laptop devices, multiprocessor systems, microprocessor-based systems, set top boxes, game consoles, programmable consumer electronics, network PCs, minicomputers, mainframe computers, distributed computing environments that include any of the above systems or devices, implementations using field programmable gate arrays ("FPGAs") and application specific integrated circuits ("ASICs"), and/or the like.

The implementation and administration of a shared resource computing environment on a single computing device may enable multiple computer users to concurrently collaborate on the same computing task or share in the same computing experience without reliance on networking hardware such as, but not limited to, network interface cards, hubs, routers, servers, bridges, switches, and other components commonly associated with communications over the Internet, as well without reliance on the software applications and protocols for communication over the Internet.

CONCLUSION

Although embodiments have been described in language specific to structural features and/or methodological acts, it is to be understood that the disclosure and appended claims are not necessarily limited to the specific features or acts described. Rather, the specific features and acts are disclosed as illustrative forms of implementing the embodiments. For example, the methodological acts need not be performed in the order or combinations described herein, and may be performed in any combination of one or more acts.

What is claimed is:

1. A computer-readable storage media storing instructions that are executable by one or more processors to configure the one or more processors to:

receive a design comprising a software representation of a physical object;
compare the design to one or more preexisting designs to determine whether the design infringes or has restrictions for use of the design, wherein the one or more processors perform at least one of
compare design metadata;
compare design files;
compare shapes of the design against the preexisting designs directly; and
compare the designs against the preexisting designs by running a potentially weighted volumetric comparison between regions of sets of shapes of the designs and the preexisting designs to determine similarities between the sets of shapes of the designs and the preexisting designs;
translate the design to manufacturing instructions comprising manufacturing steps to manufacture the design; and
transmit the manufacturing instructions to a manufacturing apparatus enabling the manufacturing apparatus to manufacture the design according to the manufacturing instructions.

2. The computer-readable storage media of claim 1, wherein the transmission of the manufacturing instructions comprises sending the manufacturing instructions to a remote location.

3. The computer-readable storage media of claim 1, the instructions further comprising: receiving, from the manufacturing apparatus, manufacturing status, manufacturing apparatus status, or combinations thereof.

4. The computer-readable storage media of claim 3, wherein the manufacturing apparatus status comprises remaining feedstock measurements, camera signals, temperature data, or combinations thereof.

5. The computer-readable storage media of claim 1, wherein the manufacturing instructions comprise instructions directed to a combination of additive manufacturing and subtractive manufacturing.

6. The computer-readable storage media of claim 1, wherein the manufacturing instructions comprise instructions directed to two or more of additive manufacturing, subtractive manufacturing, sintering, infiltration of one or more materials into the physical object, thermal curing, light-catalyzed curing, polishing, surface texturing, painting, or combinations thereof.

7. The computer-readable storage media of claim 1, wherein the translating comprises:
receiving parameter information comprising one or more of an identification of a desired manufacturing technology, associated apparatus capability parameters, user-specified design parameters, or combinations thereof; and generating manufacturing instructions based at least in part on the received parameter information.

8. A system comprising:
one or more processors;
a translation module executable by the one or more processors to translate a design comprising a software representation of a physical object to manufacturing instructions comprising manufacturing steps to manufacture the design;
a comparison module executable by the one or more processors to compare the design to one or more preexisting designs to determine whether the design infringes or has restrictions for use of the design, wherein the comparison module is further executable by the one or more processors to
compare design metadata;
compare design files;
compare shapes of the design against the preexisting designs directly; and
compare the designs against the preexisting designs by running a potentially weighted volumetric comparison between regions of sets of shapes of the designs and the preexisting designs to determine similarities between the sets of shapes of the designs and the preexisting designs; and
a transmission module executable by the one or more processor to transmit the manufacturing instruction to a manufacturing apparatus enabling the manufacturing apparatus to manufacture the design according to the manufacturing instructions.

9. The system of claim 8, wherein the transmission of the manufacturing instructions comprises sending the manufacturing instructions to a remote location for manufacturing.

10. The system of claim 8, wherein the comparison module compares one or features of the design to one or more features of the one or more preexisting designs, wherein the one or more features comprise one or more of design elements, file name, file owner, file type, file characteristics, design metadata, constructive solid geometry features, volumetric features, surface features, or feature comparisons.

11. The system of claim 8, wherein the comparison module determines, based at least in part on comparing the design to one or more preexisting designs, whether the design is associated with an owner, contributor designers, a license, a flag, or combinations thereof.

12. A method comprising:
receiving manufacturing instructions representing steps to manufacture a design representative of a physical object from a remote location;
facilitating revision of one or more of the design or manufacturing instructions by one or more parties to at least correct a design defect;
comparing the design to one or more preexisting designs to determine whether the design infringes or has restrictions for use of the design, wherein the comparing further comprises at least one of:
comparing design metadata;
comparing design files;
comparing shapes of the design against the preexisting designs directly; and
comparing the designs against the preexisting designs by running a potentially weighted volumetric comparison between regions of sets of shapes of the designs and the preexisting designs to determine similarities between the sets of shapes of the designs and the preexisting designs;
manufacturing an object, based at least in part on the manufacturing instructions;
removing the object from a manufacturing chamber; and
holding the object in a storage chamber separate from the manufacturing chamber until removed by a validated user.

13. The method of claim 12, wherein the facilitating revision comprises: one or more of converting the design or manufacturing instructions to another software representation, or implementing received user revisions.

14. The method of claim 12, further comprising notifying a user of one or more of a completion of the manufacturing of the object, an error encountered during the manufacturing of the object, via an electronic message to a separate user device.

15. The computer-readable storage media of claim 1, wherein the compare the design further comprises instructions to configure the one or more processors to perform at least one of:
normalize the designs and preexisting designs to a particular size and orientation according to respective principal axes of moments of inertia.

16. The computer-readable storage media of claim 1, wherein the computer-readable storage media further comprises instructions to configure the one or more processors to correct a design defect in the design.

17. The system of claim 8, wherein the one or more processors corrects a design defect in the design.

* * * * *

UNITED STATES PATENT AND TRADEMARK OFFICE
CERTIFICATE OF CORRECTION

| | |
|---|---|
| PATENT NO. | : 10,046,521 B2 |
| APPLICATION NO. | : 14/598180 |
| DATED | : August 14, 2018 |
| INVENTOR(S) | : Christopher Walker and John Feusi |

Page 1 of 1

It is certified that error appears in the above-identified patent and that said Letters Patent is hereby corrected as shown below:

In the Claims

In Claim 1, Column 22, Line 6, after the word "perform" insert -- : -- and delete "at least one of";

In Claim 8, Column 23, Line 14, delete "processor" and insert -- processors --;

In Claim 10, Column 23, Line 22, after "one or", first occurrence, insert -- more --;

In Claim 12, Column 24, Line 2, after "comprises" delete "at least one of"; and

In Claim 15, Column 24, Line 29, after "compare" insert -- of --.

Signed and Sealed this
Twelfth Day of March, 2019

Andrei Iancu
*Director of the United States Patent and Trademark Office*